(12) United States Patent
Otaguro

(10) Patent No.: US 6,470,927 B2
(45) Date of Patent: Oct. 29, 2002

(54) FOUP OPENER

(75) Inventor: Tetsunori Otaguro, Tokyo (JP)

(73) Assignee: Hirata Corporation (JP)

( * ) Notice: Subject to any disclaimer, the term of this patent is extended or adjusted under 35 U.S.C. 154(b) by 0 days.

(21) Appl. No.: 09/983,443

(22) Filed: Oct. 24, 2001

(65) Prior Publication Data

US 2002/0069933 A1 Jun. 13, 2002

(30) Foreign Application Priority Data

Dec. 11, 2000 (JP) ........................................ 2000-375589

(51) Int. Cl.⁷ .................................................. B65B 1/04
(52) U.S. Cl. ............................ 141/98; 141/65; 414/217; 414/937
(58) Field of Search .................. 141/98, 65; 414/217.1, 414/217, 939, 940; 220/331

(56) References Cited

U.S. PATENT DOCUMENTS 6,013,920 A * 1/2000 Gordon et al. .......... 250/559.33
6,120,229 A * 9/2000 Hofmeister ................. 414/217
6,186,723 B1 * 2/2001 Murata et al. ............... 414/217
6,318,945 B1 * 11/2001 Hofmeister ................. 118/719

FOREIGN PATENT DOCUMENTS

JP        11-145244        5/1999

* cited by examiner

Primary Examiner—Steven O. Douglas
(74) Attorney, Agent, or Firm—Lorusso & Loud

(57) ABSTRACT

A FOUP opener opens and closes a FOUP door which closes a front opening portion of a FOUP which contains a plurality of semiconductor wafers. The FOUP opener includes a dock plate for carrying and positioning the FOUP; a dock moving mechanism for moving the dock plate to a position for detachment/attachment of the FOUP door; a port door including a detachment/attachment mechanism for detaching/attaching the FOUP door and a holder mechanism for holding the FOUP door; a port plate including an opening portion, the opening portion being closed by the port door; a port door horizontal-movement mechanism for horizontally moving the port door; and a port door vertical-movement mechanism for vertically moving the port door with the port door holding the FOUP door, so as to house the FOUP door. The port door includes a seal member for sealing a space defined between an outside wall of the FOUP door and an outside wall of the port door.

5 Claims, 6 Drawing Sheets

FOUP OPENER

BACKGROUND OF THE INVENTION

1. Field of the Invention

The present invention relates to a container opener for opening/closing a sealable container for containing and transferring a plurality of semiconductor wafers oriented horizontally and arranged in layers at predetermined intervals. More particularly, the invention relates to a front opening unified pod (FOUP) opener configured such that a clean atmosphere is not contaminated with dust adhering to a FOUP door and a portion of the FOUP opener exposed to an ambient atmosphere.

2. Description of the Related Art

When dust or an evaporated organic substance (hereinafter collectively called "dust") adheres to the surface of a semiconductor wafer; i.e., when a wafer is contaminated with dust, the yield of products; i.e., the nondefective product percentage, is impaired. Thus, wafers must be maintained at a high level of cleanliness; wafers must be transferred or processed in a highly clean environment.

Wafers are generally processed in a clean room, whose cleanliness is high. Also, wafers are conveyed while being contained in a sealed FOUP, whose interior is maintained at a high level of cleanliness. Such a FOUP enables conveyance of wafers via a room of low cleanliness or the outdoors; i.e., a FOUP can protect wafers from contamination with dust during conveyance via such places.

A FOUP opener is disposed at the interface between the interior and exterior of a clean room. The FOUP opener includes a port plate having an opening portion, which can be opened/closed, and a port door for opening/closing the opening portion. A FOUP has a door (a FOUP door), which faces the opening portion of the port plate. When wafers are to be unloaded from a space maintained at a high level of cleanliness (a first control space) within the FOUP in order to undergo processing steps, the FOUP door is opened. Unloaded wafers are robotically conveyed within a wafer transfer space (a second control space) maintained at a high level of cleanliness similar to that in a processing chamber, and then transferred into a clean room, which serves as a processing chamber. Processed wafers are returned from the clean room to the high-cleanliness space within the FOUP via the wafer transfer space. Thus, wafers are moved through the opening portion of the port plate.

When no wafer is moved, the opening portion of the port plate is closed by means of the port door. The port door includes a detachment/attachment mechanism for latching the FOUP door to a FOUP body (a FOUP frame) or unlatching the FOUP door from the FOUP frame by means of a latch mechanism, and a holder mechanism for holding the FOUP door. The detachment/attachment mechanism includes a latch key for detachment/attachment use, and the holder mechanism includes a vacuum chuck pad for holding use.

As mentioned above, wafers are moved between the FOUP and the clean room, which serves as a processing chamber, via the opening portion of the port plate and the wafer transfer space. In the course of the movement, a highly clean environment must be maintained, and wafers must be protected from contamination with dust. Thus, entry of dust into a clean room serving as the wafer transfer space must be prevented. Dust which possibly enters the clean room includes dust suspended in a space of low cleanliness (an ambient atmosphere) outside the clean room, dust adhering to the FOUP (particularly the outside wall of the FOUP door), dust adhering to the outside wall of the port door exposed to the exterior of the clean room, and dust generated as a result of opening/closing of the FOUP door (dust generated as a result of operation of the latch key for detachment/attachment use and the vacuum chuck pad for holding use).

As shown in FIG. 6, a conventional FOUP opener vacuum chucks and holds a FOUP door 013 merely by means of two upper and lower vacuum chuck pads 024 provided on the outside wall of a port door 023, the outside wall facing a FOUP (i.e., the outside wall being exposed to the exterior of a clean room). Thus, the FOUP door 013 is opened/closed (detached from or attached to a FOUP frame) while dust is caught in a space 090 between the outside wall of the FOUP door 013 and the outside wall of the port door 023. Reference numeral 025 denotes a latch key for detachment/attachment use provided on the port door 023, and reference numeral 015 denotes a keyway into which the latch key 025 is inserted.

However, since the space 090 is not sealed, the clean room is contaminated as a result of scattering of contaminated air present in the space 090 (an ambient atmosphere caught in the space 090), dust adhering to the outside wall of the FOUP door 013, dust adhering to the outside wall of the port door 023, and dust generated as a result of opening/closing of the FOUP door 013 (dust generated as a result of operation of the latch key 025 for detachment/attachment use and vacuum chuck pads 024 for holding use), thus causing contamination of wafers with dust. Once the clean room is contaminated, restoration of cleanliness within the clean room to a regular, high level consumes a considerably great amount of time and involves incurrence of cost.

SUMMARY OF THE INVENTION

An object of the present invention is to provide a FOUP opener capable of minimizing the possibility of contamination of wafers with dust when a port door vacuum-chucks and holds a FOUP door at the time of opening of a FOUP in order to unload wafers from inside the FOUP for subjecting the wafers to processing, through prevention of entry, into a clean room, of contaminated air present in a space between the outside wall of the FOUP door and the outside wall of the port door facing the FOUP (the outside wall exposed to the exterior of the clean room), dust adhering to the outside wall of the FOUP door, dust adhering to the outside wall of the port door, and dust generated as a result of opening/closing of the FOUP door (dust generated as a result of operation of a latch key for detachment/attachment use and vacuum chuck pads for holding use).

To achieve the above object, the present invention provides a FOUP opener for opening and closing a FOUP door which closes a front opening portion of a FOUP containing a plurality of semiconductor wafers oriented horizontally and arranged in layers at predetermined intervals, the FOUP opener comprising a dock plate for carrying and positioning the FOUP; a dock moving mechanism for moving the dock plate to a position for detachment and attachment of the FOUP door; a port door including a detachment/attachment mechanism for detaching and attaching the FOUP door and a holder mechanism for holding the FOUP door; a port plate including an opening portion, the opening portion being closed by the port door; a port door horizontal-movement mechanism for horizontally moving the port door; and a port door vertical-movement mechanism for vertically moving the port door with the port door holding the FOUP door, so as to house the FOUP door, wherein the port door includes sealing means for sealing a space defined between an outside wall of the FOUP door and an outside wall of the port door.

Thus, the sealing means provided on the port door can seal the space defined between the outside wall of the FOUP door and the outside wall of the port door facing the FOUP (the outside wall exposed to the exterior of the clean room), and extending over substantially the entire outside wall of the FOUP door.

As a result, when the port door vacuum-chucks and holds the FOUP door at the time of opening of the FOUP in order to unload wafers from inside the FOUP for subjecting the wafers to processing, there is prevented entry, into the clean room, of contaminated air present in the space between the outside wall of the FOUP door and the outside wall of the port door facing the FOUP (an ambient atmosphere caught in the space), dust adhering to the outsidewall of the FOUP door, dust adhering to the outside wall of the port door, and dust generated as a result of opening/closing of the FOUP door (dust generated as a result of operation of the latch key for detachment/attachment use and vacuum chuck pads for holding use), thereby minimizing the possibility of contamination of wafers with dust. Thus, the clean room can be readily maintained at a high level of cleanliness in an economical manner in terms of time and cost.

Generally, the FOUP door is made of resin, and the port door is made of metal. When the resin FOUP door is vacuum-chucked and held by the vacuum chuck pads provided on the port door to thereby define a sealed space between the outside wall of the FOUP door and the outside wall of the port door facing the FOUP, the resin FOUP door exhibits intimate contact with a sealing means portion of the port door to thereby be held tight, thereby enhancing the degree of sealing of the sealed space. Thus, the possibility of contamination of wafers with dust is reduced, and the maintenance of the clean room at a high level of cleanliness can be facilitated.

Preferably, the sealing means assumes the form of a protrusion provided along the outer circumferential edge of the port door in such a manner as to project toward the FOUP door and to abut the FOUP door along the entire circumference of the FOUP door.

Thus, by means of a relatively simple structure, there can be effectively sealed the space defined between the outside wall of the FOUP door and the outside wall of the port door facing the FOUP, and extending over substantially the entire outside wall of the FOUP door.

Preferably, the sealing means comprises a packing member.

Employment of the packing member enhances the degree of sealing of the sealed space defined between the outside wall of the FOUP door and the outside wall of the port door facing the FOUP, thereby further reducing the possibility of contamination of wafers with dust and facilitating the maintenance of the clean room at a high level of cleanliness.

Preferably, the FOUP opener further comprises evacuation means for evacuating a contaminated atmosphere from the sealed space defined between the outside wall of the FOUP door and the outside wall of the port door.

As a result, since contaminated air or dust can be forcibly evacuated to the exterior of the clean room from the sealed space defined between the outside wall of the FOUP door and the outside wall of the port door, the degree of sealing of the sealed space is further enhanced. Thus, entry of contaminated air or dust into the clean room from the sealed space can be completely prevented, thereby still further reducing the possibility of contamination of wafers with dust and facilitating the maintenance of the clean room at a high level of cleanliness.

DESCRIPTION OF THE PREFERRED EMBODIMENTS

Embodiments of the present invention will next be described in detail with reference to the drawings.

First, the overall structure of a FOUP opener in a first embodiment of the present invention will be described.

Figure 1:
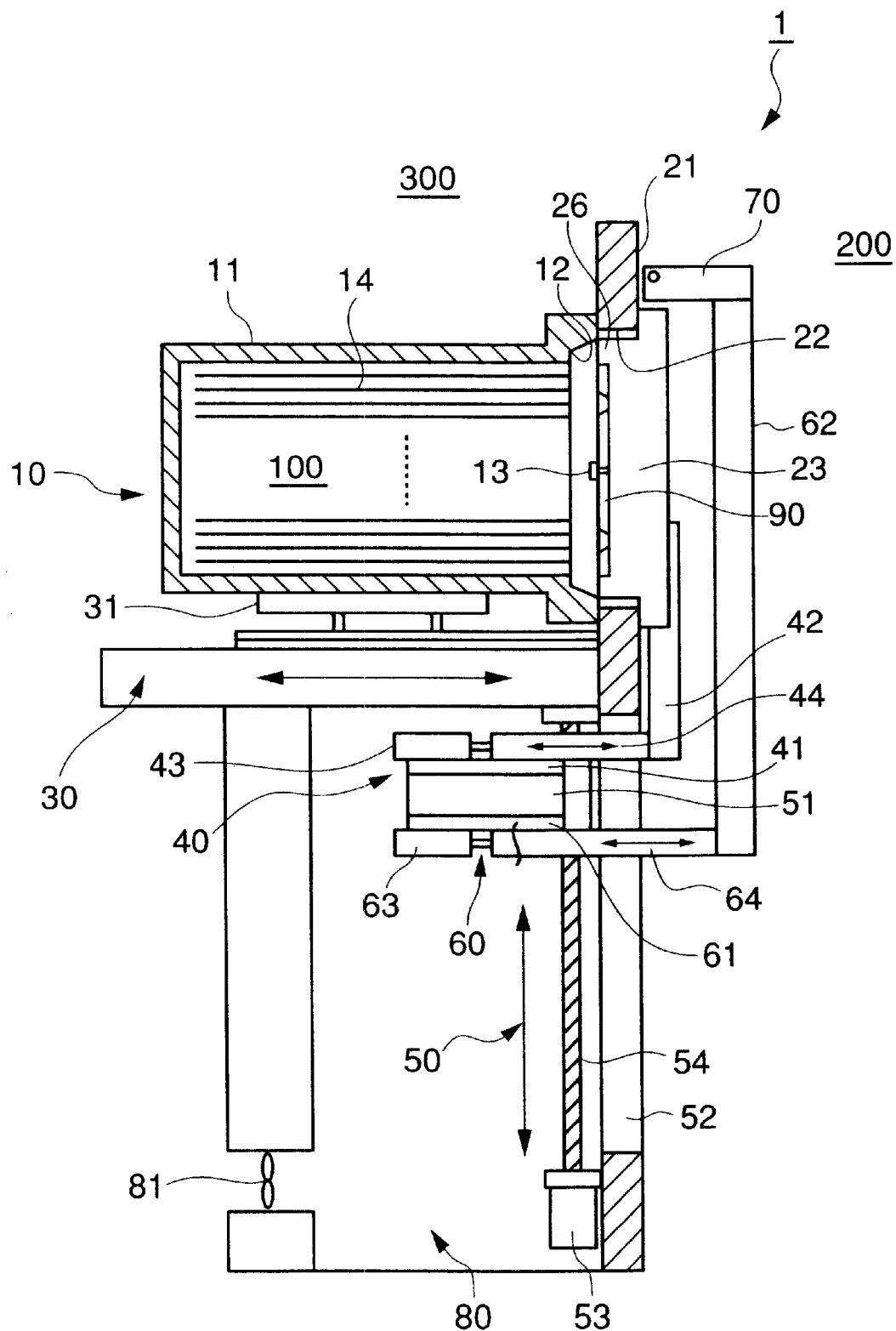
FIG. 1 is a schematic vertical sectional view of a FOUP opener in a first embodiment of the present invention showing the FOUP opener in a state before a FOUP door is opened.

As shown in FIG. 1, a FOUP opener 1 of the first embodiment includes a FOUP 10 containing a plurality of semiconductor wafers 14 oriented horizontally and arranged in layers at predetermined intervals; a dock plate 31 for carrying and positioning the FOUP 10; a dock moving mechanism 30 for moving the dock plate 31 to a position for detachment and attachment of a FOUP door 13; a port door 23 including a detachment/attachment mechanism for detaching and attaching the FOUP door 13 and a holder mechanism for holding the FOUP door 13; a port plate 21 including an opening portion 22, the opening portion 22 being closed by the port door 23; a port door horizontal-movement mechanism 40 for horizontally moving the port door 23; a sensor horizontal-movement mechanism 60 for horizontally moving a sensor bracket 62, the sensor bracket 62 having a mapping sensor 70, which is mounted on an upper portion thereof and adapted to detect presence/absence, storage condition, and position of the wafers 14 contained in the FOUP 10; and a port-door-and-sensor vertical-movement mechanism 50 for vertically moving the port door 23 and the mapping sensor 70 with the port door 23 holding the FOUP door 13, so as to house the FOUP door 13 in a front end (a second control space 200).

The FOUP 10 assumes the form of a sealed container when a front opening portion 12 of a FOUP frame 11 serving as a body of the FOUP 10 is closed by the FOUP door 13. The port plate 21 and the port door 23 partially constitute an interface wall of the front end configured to interface with the FOUP 10 and are adapted to isolate the second control space 200, which is configured as a clean room and serves as a wafer transfer space, from an ambient atmosphere 300. The sensor bracket 62 (not shown in detail) assumes the form of a rectangular frame and is arranged in such a manner as to surround the port door 23 with a slight gap formed therebetween.

Figure 2:
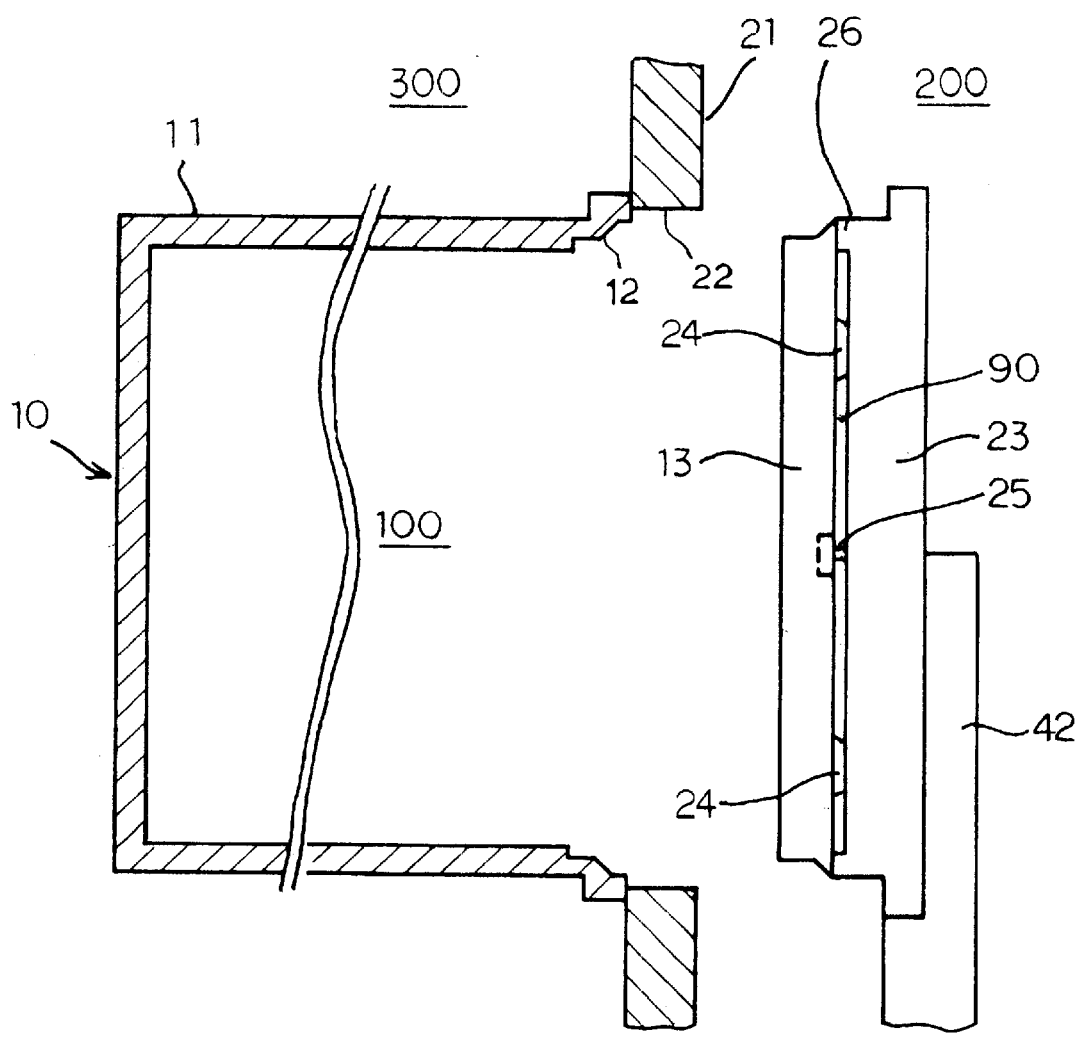
FIG. 2 is a schematic partial vertical sectional view of the FOUP opener of FIG. 1 showing the FOUP opener in a state immediately after the FOUP door is opened.
Figure 3:
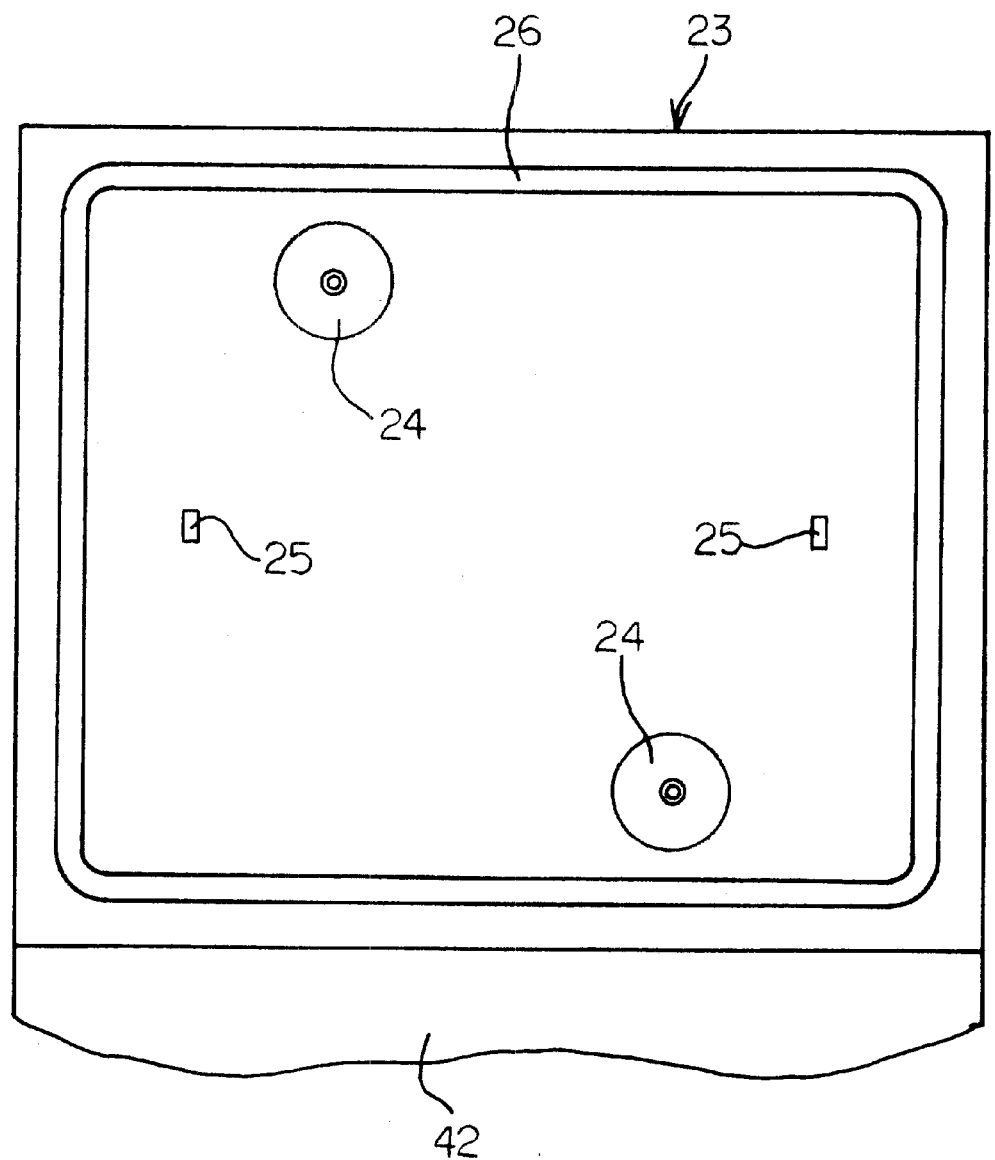
FIG. 3 is a front view of a port door of the FOUP opener of FIG. 1.
Figure 4:
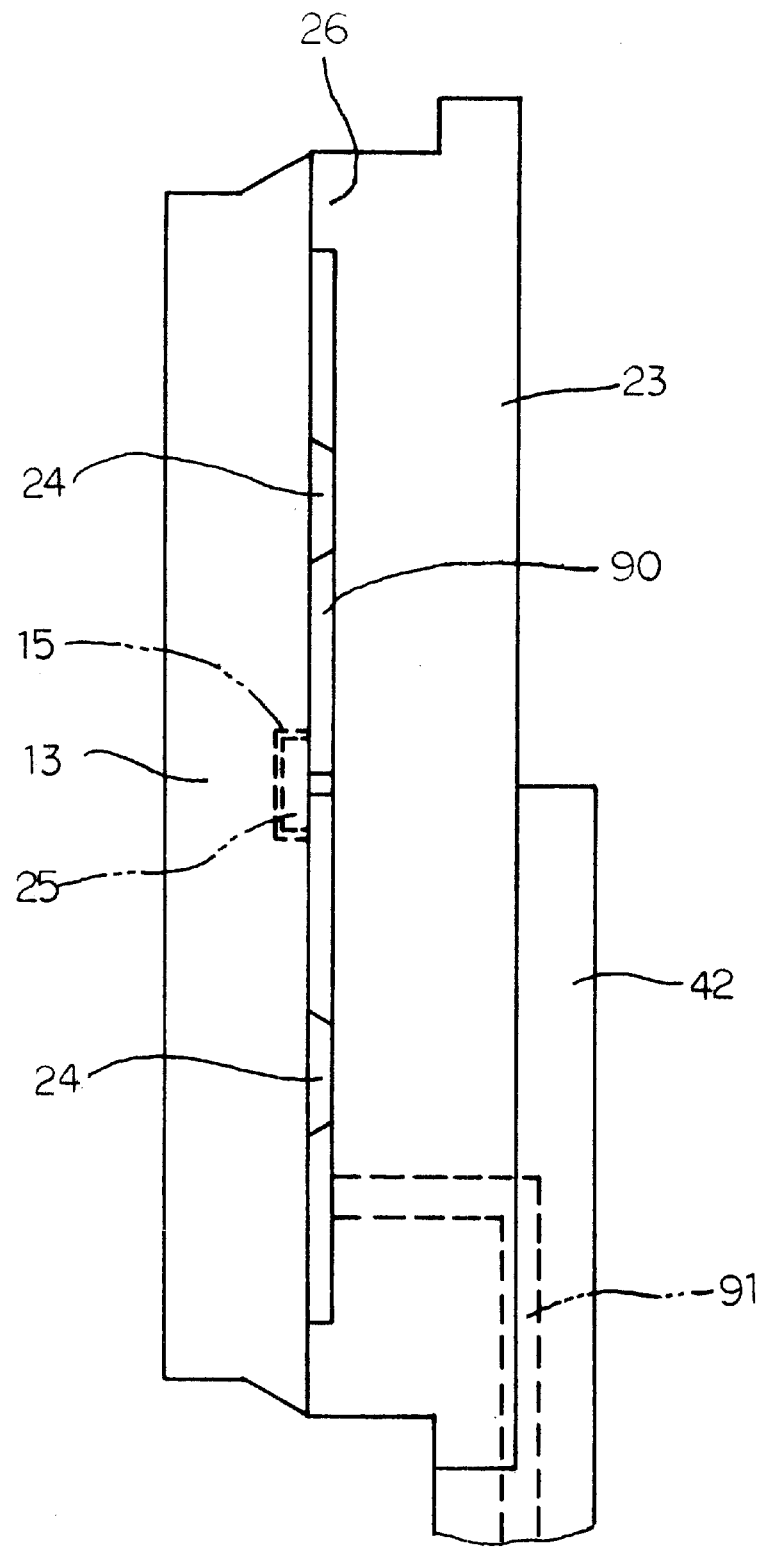
FIG. 4 is an enlarged vertical sectional view of a sealing structure for the outside wall of the FOUP door of the FOUP opener in the first embodiment, showing also a sealing structure for the outside wall of a FOUP door of a FOUP opener in a third embodiment of the present invention.

As shown in FIGS. 2 to 4, the detachment/attachment mechanism provided on the port door 23 and adapted to detach/attach the FOUP door 13 includes two latch keys 25 (located at right-hand and left-hand positions in FIG. 3) provided on the port door 23 and adapted to latch the FOUP door 13 to the front opening portion 12 of the FOUP frame 11 or to unlatch the FOUP door 13 from the front opening portion 12 of the FOUP frame 11 by means of a latch mechanism. The holder mechanism provided on the port door 23 and adapted to hold the FOUP door 13 includes two vacuum chuck pads 24 (located at upper left and lower right positions in FIG. 3), which communicate with a vacuum source. The FOUP door 13 has keyways 15 formed therein in order to receive the corresponding latch keys 25. The keyways 15 serve as operation ends of the latch mechanism (not shown in detail).

The port door horizontal-movement mechanism 40 is configured in the following manner. An arm member 44 is perpendicularly attached to a lower end portion of a lower extension member 42 extending downward from the port door 23. The arm member 44 is disposed on the upper surface of a vertical-movement platform 51 of the port-door-and-sensor vertical-movement mechanism 50, which will be described later, in a condition slidable along a linear guide 41. An end portion of the arm member 44 is connected to an output shaft of a port door horizontal-movement mechanism drive motor 43, which is operative to move the arm member 44 horizontally (in the right-and-left direction in FIG. 1). The arm member 44 extends through a guide slit 52 formed in the port plate 21 in such a manner as to extend downward from underneath an opening portion 22 of the port plate 21. The arm member 44 moves horizontally and vertically along the guide slit 52.

The sensor horizontal-movement mechanism 60 is configured in the following manner. An arm member 64 is perpendicularly attached to a lower end portion of the sensor bracket 62 and disposed on the lower surface of the vertical-movement platform 51 of the port-door-and-sensor vertical-movement mechanism 50, which will be described later, in a condition slidable along a linear guide 61. An end portion of the arm member 64 is connected to an output shaft of a sensor horizontal-movement mechanism drive motor 63, which is operative to move the arm member 64 horizontally. As in the case of the arm member 44, the arm member 64 extends through the guide slit 52 while being located underneath the arm member 44, and moves horizontally and vertically along the guide slit 52.

Although not illustrated in detail, the vertical-movement platform 51, the arm member 44, and the arm member 64 are provided at each of right-hand and left-hand positions which are biased toward the right-hand and left-hand side edges (the far-side and near-side edges with respect to the paper of FIG. 1) of the port plate 21. The right-hand and left-hand vertical-movement platforms 51 are connected unitarily by means of an unillustrated connection member extending in the right-and-left direction (in the far-side-and-near-side direction with respect to the paper of FIG. 1). The connection member has a nut accommodating portion formed at a central portion along the right-and-left direction. The nut accommodating portion accommodates a ball nut engaged with a screw shaft 54. As the screw shaft 54 is rotated by a servomotor 53, the nut accommodating portion which houses the ball nut engaged with the screw shaft 54 is caused to move vertically; i.e., the connection member having the nut accommodating portion moves vertically. The vertical movement of the connection member causes the port door 23 and the sensor bracket 62 to move vertically as a unit via the paired vertical-movement platforms 51, arm members 44, and arm members 64.

Although not illustrated in detail, the port door horizontal-movement mechanism drive motor 43 is fixedly provided on the upper surface of the right-hand vertical-movement platform 51, whereas the sensor horizontal-movement mechanism drive motor 63 is fixedly provided on the lower surface of the left-hand vertical-movement platform 51. Thus, through installation of the port door horizontal-movement drive motor 43 and the sensor horizontal-movement drive motor 63 in opposition to each other in the right-and-left direction, weight balance is established in the right-and-left direction for a unitary assembly composed of the connection member, paired right- and left-hand vertical-movement platforms 51, and the motors 43 and 63. However, the motors 43 and 63 may be fixedly provided on the upper and lower surfaces, respectively, of the right-hand or left-hand vertical-movement platform 51.

The servomotor 53, the screw shaft 54, the connection member having the nut accommodating portion, and the paired vertical-movement platforms 51 constitute the port-door-and-sensor vertical-movement mechanism 50. As shown in FIG. 1, the port-door-and-sensor vertical-movement mechanism 50 is disposed in opposition to the clean room (the second control space 200)—which houses the port door 23 and the sensor bracket 62—with respect to the port plate 21 while being housed in a drive section chamber 80.

Since the port-door horizontal-movement mechanism drive motor 43 and the sensor horizontal-movement mechanism drive motor 63 are fixedly provided on the right- and left-hand vertical-movement platforms 51, respectively, the motors 43 and 63 are also housed in the drive section chamber 80. Also, the drive section chamber 80 houses portions of the arm members 44 of the port door horizontal-movement mechanism 40 which slide along the linear guide 41 and portions of the arm members 64 of the sensor horizontal-movement mechanism 60 which slide along the linear guide 61.

Accordingly, the drive section (which is composed of the port door horizontal-movement mechanism drive motor 43 and the linear guide 41) of the port door horizontal-movement mechanism 40, the drive section (which is composed of the sensor horizontal-movement mechanism drive motor 63 and the linear guide 61) of the sensor horizontal-movement mechanism 60, and the drive section (which is composed of the servomotor 53, the screw shaft 54, the connection member having the nut accommodating portion, and the paired right- and left-hand vertical-movement platforms 51) of the port-door-and-sensor vertical-movement mechanism 50 are disposed in opposition to the clean room 200—which houses the port door 23 and the sensor bracket 62—with respect to the port plate 21 to thereby be isolated from the clean room 200 while being housed in the drive section chamber 80.

The drive section chamber 80 is equipped with a fan 81 for exhausting an atmosphere in the drive section chamber 80 to the exterior of the drive section chamber 80. The fan 81 is operative to exhaust dust generated from the drive section of the port door horizontal-movement mechanism 40, the drive section of the sensor horizontal-movement mechanism 60, and the drive section of the port-door-and-sensor vertical-movement mechanism 50, to the ambient atmosphere 300, thereby preventing contamination of the clean room 200 with the dust. Preferably, the fan 81 is installed on a wall of the drive section chamber 80 at the lowest possible position.

Next, the holder mechanism provided on the port door 23 and adapted to hold the FOUP door 13 will be described in detail.

As mentioned previously, the port door 23 includes the holder mechanism for holding the FOUP door 13. The holder mechanism functions such that the vacuum chuck pads 24 communicating with a vacuum source vacuum-chucks the outside wall of the FOUP door 13, thereby enabling the port door 23 to hold the FOUP door 13. When, at the time of opening of the FOUP 10 in order to unload the wafers 14 from inside the FOUP 10 for subjecting the wafers 14 to processing, the detachment/attachment mechanism provided on the port door 23 and adapted to detach/attach the FOUP door 13 is operated so as to unlatch the FOUP door 13 from the opening portion 12 of the FOUP frame 11 by means of the latch mechanism, the FOUP door 13 is detached from the FOUP, frame 11. Then, the holder mechanism is operated, so that the port door 23 holds the FOUP door 13.

When the port door 23 holds the FOUP door 13, a sealing means 26 provided on the port door 23 seals a space 90 defined between the outside wall of the FOUP door 13 and the outside wall of the port door 23 facing the FOUP 10 (the outside wall exposed to the exterior of the clean room 200), and extending over substantially the entire outside wall of the FOUP door 13.

As shown in FIGS. 1 to 4, the sealing means 26 assumes the form of a protrusion provided along the outer circumferential edge of the port door 23 in such a manner as to project toward the FOUP door 13 and to abut the FOUP door 13 along the entire circumference of the FOUP door 13. The protrusion has a flat top face and is formed into a rectangular shape of strip. However, no limitations are imposed on the form of the top face of the protrusion. For example, a central portion of the top face may be formed into a slightly sharpened shape. In either case, a vacuum chuck force generated by the holder mechanism of the port door 23 is exerted on a portion of the FOUP door 13 in contact with the top face of the protrusion. Thus, a contact pressure at the portion of the FOUP door 13 increases, thereby enhancing the effect of sealing the space 90. In this manner, the outside wall of the FOUP door 13 (an end wall of the FOUP door 13 which is exposed to the ambient atmosphere 300 when the FOUP 10 is closed by means of the FOUP door 13) is sealed.

Next, the operation of the FOUP opener 1 of the first embodiment will be described in detail.

In FIG. 1, the FOUP door 13 is about to be detached from the FOUP frame 11, and the port door 23 and the mapping sensor 70 are on standby. First, when the port door 23 vacuum-chucks and holds the FOUP door 13, the port door horizontal-movement mechanism 40 operates so as to retreat the port door 23 horizontally while the port door 23 is holding the FOUP door 13 (see FIG. 2). Then, the port-door-and-sensor vertical-movement mechanism 50 operates so as to lower the sensor bracket 62, together with the port door 23, to a position where the mapping sensor 70 is to be caused to enter the FOUP 10, thereby positioning the mapping sensor 70.

Next, the sensor horizontal-movement mechanism 60 operates so as to cause the mapping sensor 70 to enter the FOUP 10 independently of the port door 23. Subsequently, the port-door-and-sensor vertical-movement mechanism 50 operates so as to lower the mapping sensor 70, together with the port door 23, to the bottom wafer position. During the lowering movement, the mapping sensor 70 detects presence/absence, storage condition (inclined insertion, multiple insertion, etc.), and position (height) of the wafers 14 contained in the FOUP 10. The results of detection are transmitted to an unillustrated wafer transfer robot one after another.

When the mapping sensor 70 lowers to the bottom wafer position, the sensor horizontal-movement mechanism 60 operates so as to retreat the mapping sensor 70 from inside the FOUP 10 independently of the port door 23. Finally, the port-door-and-sensor vertical-movement mechanism 50 operates so as to lower and retreat the port door 23 and the mapping sensor 70 in unison, thereby housing the FOUP door 13 in the front end (the second control space 200).

The first embodiment is configured and functions as described above, thereby yielding the following effects.

The sealing means 26 provided on the port door 23 can seal the space 90 defined between the outside wall of the FOUP door 13 and the outside wall of the port door 23 facing the FOUP 10 (the outside wall exposed to the exterior of the clean room 200), and extending over substantially the entire outside wall of the FOUP door 13. Thus, when the port door 23 vacuum-chucks and holds the FOUP door 13 at the time of opening of the FOUP 10 in order to unload the wafers 14 from inside the FOUP 10 for subjecting the wafers 14 to processing, there is prevented entry, into the clean room 200, of contaminated air present in the space 90 between the outside wall of the FOUP door 13 and the outside wall of the port door 23 facing the FOUP 10 (an ambient atmosphere 300 caught in the space 90), dust adhering to the outside wall of the FOUP door 13, dust adhering to the outside wall of the port door 23, and dust generated as a result of opening/closing of the FOUP door 13 (dust generated as a result of operation of the latch key 25 for detachment/attachment use and vacuum chuck pads 24 for holding use), thereby minimizing the possibility of contamination of the wafers 14 with dust. Thus, the clean room 200 can be readily maintained at a high level of cleanliness in an economical manner in terms of time and cost.

Generally, the FOUP door 13 is made of resin, and the port door 23 is made of metal. When the resin FOUP door 13 is vacuum-chucked and held by the vacuum chuck pads 24 provided on the port door 23 to thereby define the sealed space 90 between the outside wall of the FOUP door 13 and the outside wall of the port door 23 facing the FOUP 10, the resin FOUP door 13 exhibits intimate contact with the sealing means 26 of the port door 23 to thereby be held tight, thereby enhancing the degree of sealing of the sealed space 90. Thus, the possibility of contamination of the wafers 14 with dust is reduced, and the maintenance of the clean room 200 at a high level of cleanliness can be facilitated.

The sealing means 26 assumes the form of a protrusion provided along the outer circumferential edge of the port door 23 in such a manner as to project toward the FOUP door 13 and to abut the FOUP door 13 along the entire circumference of the FOUP door 13. Thus, by means of a relatively simple structure, there can be effectively sealed the space 90 defined between the outside wall of the FOUP door 13 and the outside wall of the port door 23 facing the FOUP 10, and extending over substantially the entire outside wall of the FOUP door 13.

Next, a second embodiment of the present invention will be described with reference to FIG. 5.

Figure 5:
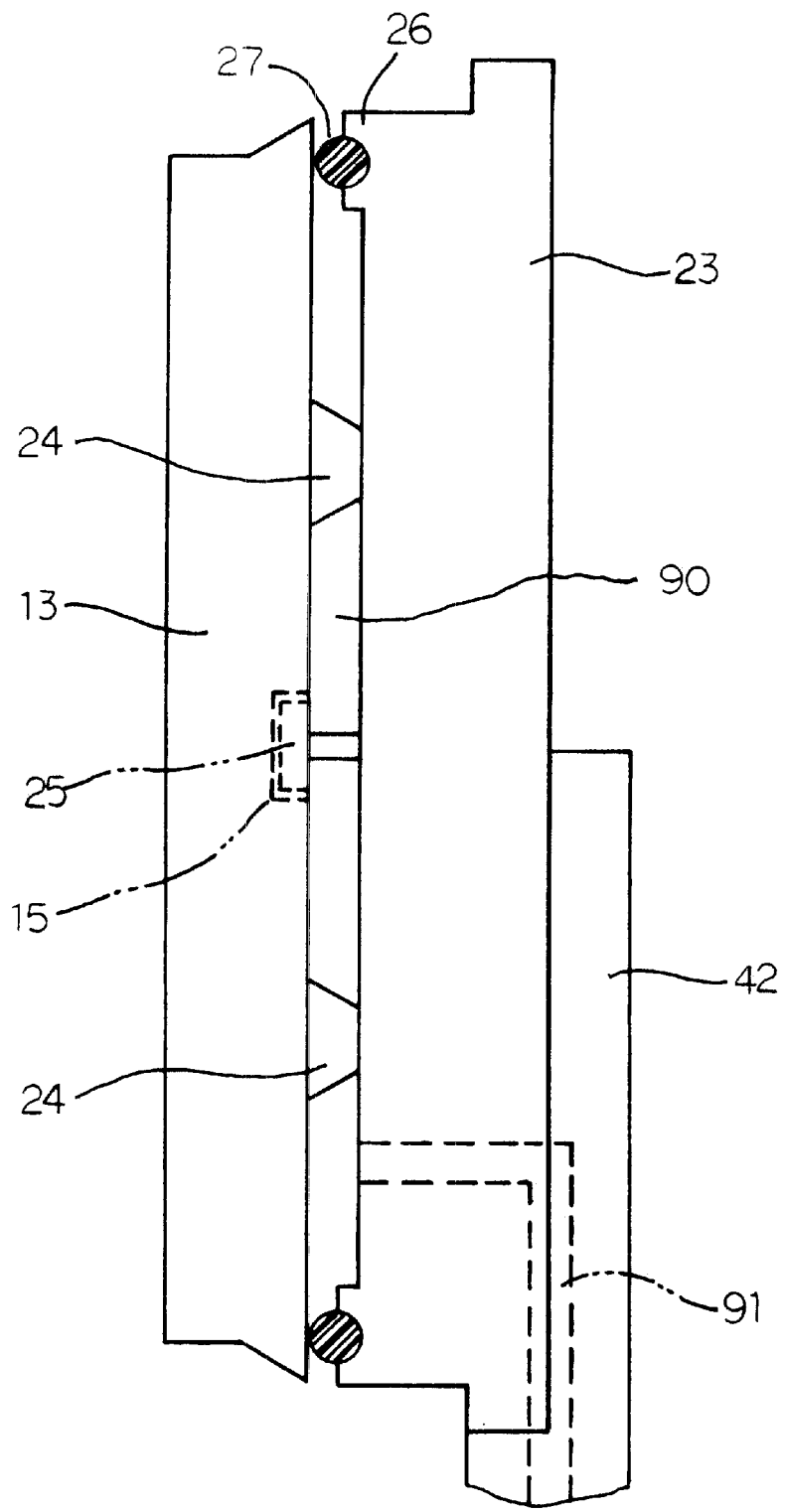
FIG. 5 is an enlarged vertical sectional view of a sealing structure for the outside wall of a FOUP door of a FOUP opener in a second embodiment of the present invention, showing also a sealing structure for the outside wall of a FOUP door of a FOUP opener in a fourth embodiment of the present invention.
Figure 6:
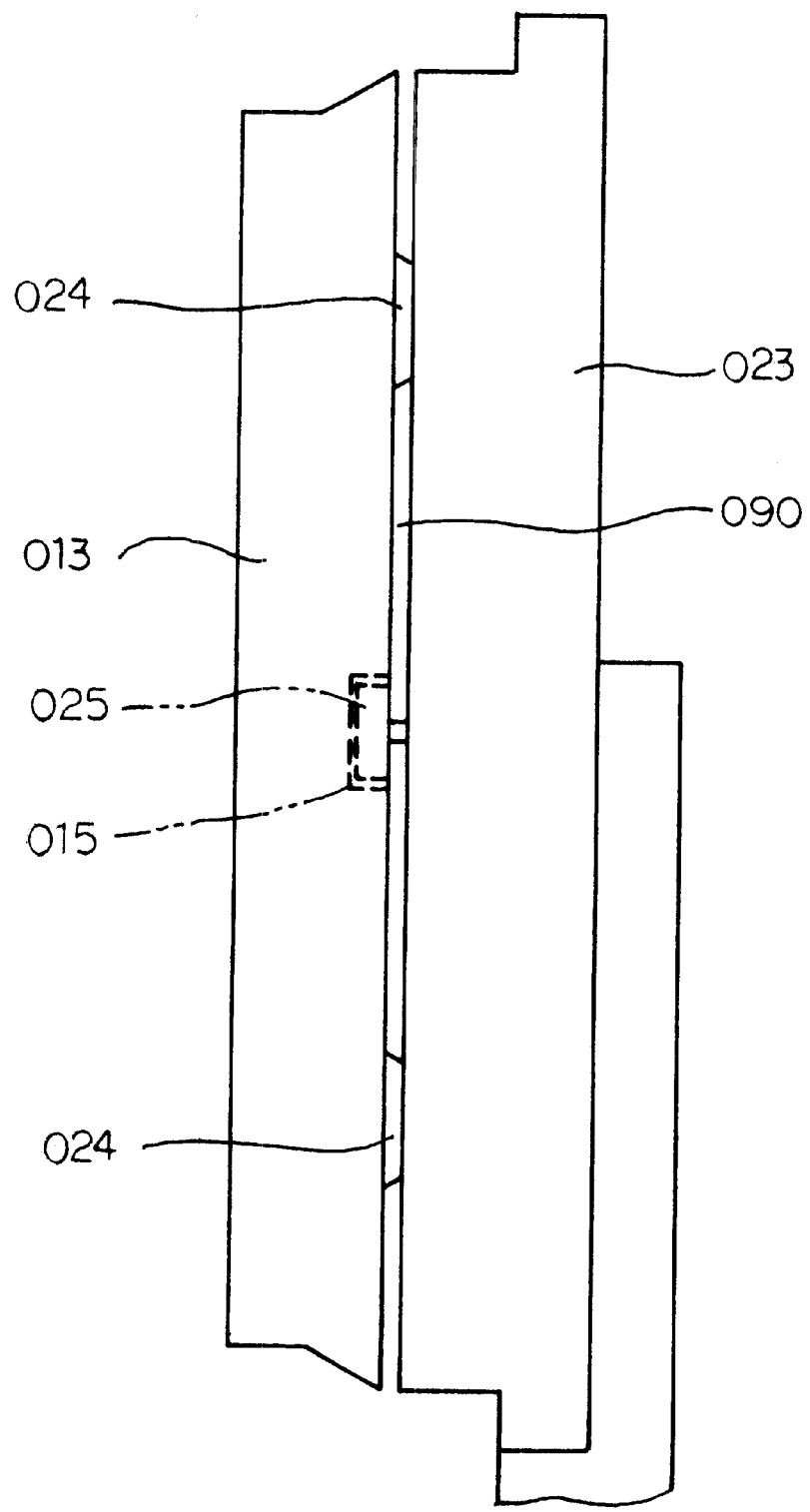
FIG. 6 is a schematic partial vertical sectional view of a conventional FOUP opener.

FIG. 5 is a vertical sectional view of a sealing structure for the outside wall of a FOUP door of a FOUP opener in the second embodiment, and corresponds to FIG. 4, which has been referred to in the first embodiment. Common reference numerals are assigned to portions of the sealing structure common to the first and second embodiments.

The sealing structure for the outside wall of the FOUP door of the FOUP opener in the second embodiment differs from that in the first embodiment in that a packing 27 having a circular cross section is embedded on the flat top face of the sealing means 26, which assumes the form of a protrusion, along the entire circumference of the same. Since other features are similar to those of the first embodiment, repeated description thereof is omitted.

The packing 27 is made of rubber or synthetic resin and thus elastic. Thus, when the vacuum chuck pads 24 provided on the port door 23 vacuum-chuck and hold the FOUP door 13, the FOUP door 13 exhibits more intimate contact with the packing 27 to thereby be held tighter, thereby further enhancing the degree of sealing of the sealed space 90. Thus, the possibility of contamination of the wafers 14 with dust is further reduced, and the maintenance of the clean room 200 at a high level of cleanliness can be further facilitated. Also, the second embodiment can yield effects similar to those yielded by the first embodiment.

Next, a third embodiment of the present invention will be described with reference to FIG. 4.

FIG. 4 is an enlarged vertical sectional view of the sealing structure for the outside wall of the FOUP door of the FOUP opener in the first embodiment, showing also a sealing structure for the outside wall of a FOUP door of a FOUP opener in the third embodiment.

The sealing structure for the outside wall of the FOUP door 13 of the FOUP opener 1 in the third embodiment differs from that in the first embodiment in that an evacuation means 91 is provided for evacuating a contaminated atmosphere from the sealed space 90 defined between the outside wall of the FOUP door 13 and the outside wall of the port door 23.

The evacuation means 91 assumes the form of a bore extending through the port door 23 and the lower extension member 42 extending downward from the port door 23. One end of the bore opens into the sealed space 90, whereas the other end opens into the drive section chamber 80, which is not illustrated in detail. Contaminated air or dust is evacuated from the sealed space 90 through the bore by means of the fan 81 or another evacuation fan.

Since other features are similar to those of the first embodiment, repeated description thereof is omitted.

As a result of the third embodiment employing the above-described sealing structure, contaminated air or dust can be forcibly evacuated to the exterior of the clean room 200 from the sealed space 90 defined between the outside wall of the FOUP door 13 and the outside wall of the port door 23, so that the degree of sealing of the sealed space 90 is further enhanced. Thus, entry of contaminated air or dust into the clean room 200 from the sealed space 90 can be completely prevented, thereby still further reducing the possibility of contamination of the wafers 14 with dust and facilitating the maintenance of the clean room 200 at a high level of cleanliness. Also, the third embodiment can yield effects similar to those yielded by the first embodiment.

Next, a fourth embodiment of the present invention will be described with reference to FIG. 5.

FIG. 5 is a vertical sectional view of the sealing structure for the outside wall of the FOUP door of the FOUP opener in the second embodiment, showing also a sealing structure for the outside wall of a FOUP door of a FOUP opener in the fourth embodiment.

The sealing structure for the outside wall of the FOUP door 13 of the FOUP opener 1 in the fourth embodiment differs from that in the second embodiment in that the evacuation means 91 employed in the third embodiment is provided. Since other features are similar to those of the second embodiment, repeated description thereof is omitted.

As a result of the fourth embodiment employing the above-described sealing structure, the fourth embodiment can yield effects similar to those yielded by the evacuation means 91 in the third embodiment as well as those yielded by the second embodiment.

What is claimed is:

1. A FOUP opener for opening and closing a FOUP door which closes a front opening portion of a FOUP containing a plurality of semiconductor wafers oriented horizontally and arranged in layers at predetermined intervals, said FOUP opener comprising:

a dock plate for carrying and positioning said FOUP;

a dock moving mechanism for moving said dock plate to a position for detachment and attachment of said FOUP door;

a port door including a detachment/attachment mechanism for detaching and attaching said FOUP door and a holder mechanism for holding said FOUP door;

a port plate including an opening portion, the opening portion being closed by said port door;

a port door horizontal-movement mechanism for horizontally moving said port door; and a port door vertical-movement mechanism for vertically moving said port door with said port door holding said FOUP door, so as to house said FOUP door, wherein said port door includes a protrusion provided along an outer circumferential edge of said port door in such a manner as to project toward said FOUP door and to abut said FOUP door along an entire circumference of said FOUP door, thereby sealing a space defined between an outside wall of said FOUP door and an outside wall of said port door.

2. A FOUP opener as described in claim 1, wherein said sealing means comprises a packing member.

3. A FOUP opener as described in claim 2, further comprising evacuation means for evacuating a contaminated atmosphere from a sealed space defined between the outside wall of said FOUP door and an outside wall of said port door.

4. A FOUP opener as described in claim 1, further comprising evacuation means for evacuating a contaminated atmosphere from a sealed space defined between the outside wall of said FOUP door and an outside wall of said port door.

5. A FOUP opener as described in claim 1 wherein said sealing means seals a space defined between said outside wall of said FOUP door and said outside wall of said port door which extends over substantially the entire outside wall of the FOUP door.

* * * * *